(12) United States Patent
Clemence et al.

(10) Patent No.: US 10,690,706 B2
(45) Date of Patent: Jun. 23, 2020

(54) DEVICE FOR MEASURING AN ELECTRICAL QUANTITY OF ONE PHASE OF AN AC ELECTRIC CURRENT OF AN OVERHEAD ELECTRICAL NETWORK

(71) Applicant: SCHNEIDER ELECTRIC INDUSTRIES SAS, Rueil-Malmaison (FR)

(72) Inventors: Michel Clemence, Chambery (FR); Pascal Houbre, Jarrie (FR); Erick Contini, Meylan (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 53 days.

(21) Appl. No.: 16/077,300

(22) PCT Filed: Feb. 10, 2017

(86) PCT No.: PCT/EP2017/052951
§ 371 (c)(1),
(2) Date: Aug. 10, 2018

(87) PCT Pub. No.: WO2017/137534
PCT Pub. Date: Aug. 17, 2017

(65) Prior Publication Data
US 2019/0049491 A1 Feb. 14, 2019

(30) Foreign Application Priority Data
Feb. 12, 2016 (FR) ..................................... 16 51169

(51) Int. Cl.
*G01R 19/25* (2006.01)
*G01R 31/08* (2020.01)
(Continued)

(52) U.S. Cl.
CPC ....... *G01R 19/2513* (2013.01); *G01R 15/165* (2013.01); *G01R 19/2506* (2013.01);
(Continued)

(58) Field of Classification Search
CPC ................................................. G01R 19/2513
See application file for complete search history.

(56) References Cited

U.S. PATENT DOCUMENTS

| 2002/0171433 A1 | 11/2002 | Watanabe et al. |
| 2013/0229735 A1 | 9/2013 | Rostron et al. |

(Continued)

FOREIGN PATENT DOCUMENTS

EP 3001207 A1 * 3/2016 ......... G01R 19/2513

OTHER PUBLICATIONS

International Search Report dated May 12, 2017, in PCT/EP2017/052951 filed Feb. 10, 2017.

(Continued)

*Primary Examiner* — Walter L Lindsay, Jr.
*Assistant Examiner* — Milton Gonzalez
(74) *Attorney, Agent, or Firm* — Oblon, McClelland, Maier & Neustadt, L.L.P.

(57) ABSTRACT

The invention relates to a device for measuring an electrical quantity of one phase of an AC electric current in an overhead electrical network, comprising: a sensor designed to be attached to an electric line of the network, the sensor including: an electrically conductive plate; an electrical conductor, designed to electrically connect the plate to the line, in order to circulate a first current from the line through the conductor; a processing unit, designed to determine the electrical quantity from value values of the first electric current and a value of a capacitance between the plate and ground. The device also comprises a generator, electrically connected to the conductor and designed to inject a second (Continued)

current through the conductor, the second current having a frequency other than the frequency of the first current, the processing unit also being designed to calculate the capacitance between the plate and ground as a function of the second current.

11 Claims, 2 Drawing Sheets

(51) Int. Cl.
*G01R 29/12* (2006.01)
*H04B 3/46* (2015.01)
*G01R 31/50* (2020.01)
*G01R 15/16* (2006.01)

(52) U.S. Cl.
CPC ............ *G01R 29/12* (2013.01); *G01R 31/085* (2013.01); *G01R 31/50* (2020.01); *H04B 3/46* (2013.01)

(56) References Cited

U.S. PATENT DOCUMENTS

| | | |
|---|---|---|
| 2014/0035595 A1 | 2/2014 | Neti et al. |
| 2015/0077088 A1 | 3/2015 | Divan et al. |
| 2015/0168480 A1* | 6/2015 | Robin ................ G01R 31/1272 324/551 |

OTHER PUBLICATIONS

French Search Report dated Oct. 27, 2016, in French Application 1651169 filed Feb. 12. 2016.

* cited by examiner

DEVICE FOR MEASURING AN ELECTRICAL QUANTITY OF ONE PHASE OF AN AC ELECTRIC CURRENT OF AN OVERHEAD ELECTRICAL NETWORK

TECHNICAL FIELD

The invention relates to a device for measuring an electrical quantity of one phase of an AC electric current of an overhead electrical network. The invention relates to a method for measuring such an electrical quantity.

BACKGROUND

In a known manner, sensors exist for measuring an electrical quantity in an overhead electrical network, such as an electric voltage of a phase of an AC current circulating in this network. "Overhead electrical network" refers to an electrical transport network that includes at least one overhead electric line, i.e., an electrical conductor that extends above the ground and is in contact with the ambient air.

One example of such a sensor includes a metal plate arranged between an overhead electric line of the electrical network and the ground. This sensor makes it possible to measure an electrical quantity of the electric current circulating in the line.

However, the measurement of the electrical quantity, done by this sensor, is not always reliable.

The following documents are also known from the state of the art: US-2015/0077088-A1 and US-2014/035595-A1.

SUMMARY

The aim of the invention is then to propose a device and a method for measuring an electrical property of a phase of an AC electric current in an overhead electrical network, making it possible to provide a more reliable measurement of the electrical quantity.

To that end, the invention relates to a device for measuring an electrical quantity of one phase of an AC electric current of an overhead electrical network, this device including:
a sensor, configured to be attached to an electric line of the overhead electrical network, this sensor comprising:
an electrically conductive plate,
an electrical conductor, configured to electrically connect the plate to the electric line, for the circulation of a first electric current from the electric line through the electrical conductor,
a computation unit, configured to determine the electrical quantity from a value of the first electric current and a value of an electrical capacity between the plate and the ground.

According to the invention, the device further includes a generator, electrically connected to the electrical conductor and configured to inject a second electric current through the electrical conductor, this second electric current having a frequency different from the frequency of the first electric current, the computation unit further being configured to compute the value of the electrical capacity between the plate and the ground as a function of a value of the second electric current.

Owing to the invention, it is possible to calibrate the measuring device before each measurement of the electrical property by measuring the value of the electrical capacity between the plate and the ground. Indeed, the value of the electrical capacity between the plate and the ground is not constant and may vary significantly, based on environmental conditions, such as the temperature or the humidity level in the air surrounding the overhead line. The value of the electrical capacity therefore fluctuates over time, to such a point that the predefined value of this capacity, used to determine the electric voltage, no longer always corresponds to the actual value of this electrical capacity.

This measurement is done by injecting the second electric current, the value of which is known. Since this electric current has a frequency different from the frequency of the first electric current, it is able to be measured separately from the first electric current.

According to advantageous but optional aspects of the invention, such a measuring device includes one or more of the following features, considered in any technically possible combination:
a second electrically conductive plate, and
a second electrical conductor, configured to electrically connect the second plate to the electric line for the circulation of at least part of the first electric current from the electric line to the second plate through the second electrical conductor, the second electrical conductor being electrically connected to the output of the generator for the circulation of at least part of the second current injected through the second conductor;
a first measuring apparatus configured to measure the first electric current and the second electric current circulating through the electrical conductor;
the first electrical conductor has a first resistance, the first measuring apparatus including a first voltage sensor to measure the electric voltage across the terminals of the first resistance;
a second measuring apparatus configured to measure the first electric current and the second electric current circulating through the second electrical conductor;
the second electrical conductor has a second resistance, the second measuring apparatus including a second voltage sensor to measure the electric voltage across the terminals of the second resistance;
the electrical capacity $C_{pt}$ is computed by the computation unit according to the equation:

$$C_{pt} = \frac{U_{m1} - U_{m2}}{\omega \times R_m (1-K') \times (U_p - U_{m1})}$$

where $U_{m1}$ and $U_{m2}$ are respectively the electric voltages measured by the first and second measuring apparatuses, $\Omega$ is the pulse of the AC current circulating in the overhead electrical network, $U_p$ is the electric voltage across the terminals of the generator injecting the second electric current, $R_m$ is equal to the value of the first resistance and K' is a numerical value that depends on the ratio between the distance d' and the distance d, d being the distance between the first plate and the electric line and d' being the distance between the second plate and the electric line;
when the first and second sensors are attached to the electric line, the device includes first and second stray electrical capacities that respectively connect the first and second plates to the electric line and allow the circulation, from the electric line, of first and second electric leak currents;
the value K' is equal to the ratio between the second and first electric leak currents;
the frequency of the second injected electric current is comprised between 1 kHz and 1 MHz, preferably between 10 kHz and 100 kHz;

the electrical quantity is the voltage of the phase of the AC current.

According to another aspect, the invention relates to a method for measuring an electrical quantity of one phase of an AC electric current of an overhead electrical network, this method including:

a) attaching a sensor to an overhead electric line of the electrical network, this sensor comprising:
an electrically conductive plate,
an electrical conductor, configured to electrically connect the plate to the electric line, such that a first electric current circulates from the electric line through the electrical conductor, b) measuring the first electric current circulating through the electrical conductor, using a measuring apparatus, c) computing an electrical quantity, using a computation unit, from the measured first electric current and the value of the electrical capacity between the plate and the ground, wherein the method includes, before the attachment, a calibration sequence to determine a value of the electrical capacity, this calibration sequence comprising:

i) injecting, using a generator, a second electric current through the electrical conductor, this second electric current having a frequency different from the frequency of the first electric current, ii) measuring, using the measuring apparatus, the second electric current circulating in the electrical conductor, iii) determining, via the computation unit and based on the measured second electric current, the value of the electrical capacity.

BRIEF DESCRIPTION OF THE DRAWINGS

The invention will be better understood and other advantages thereof will appear more clearly in light of the following description of one embodiment of a measuring device provided solely as a non-limiting example and done in reference to the appended drawings, in which.

DETAILED DESCRIPTION OF THE EMBODIMENTS

Figure 1:
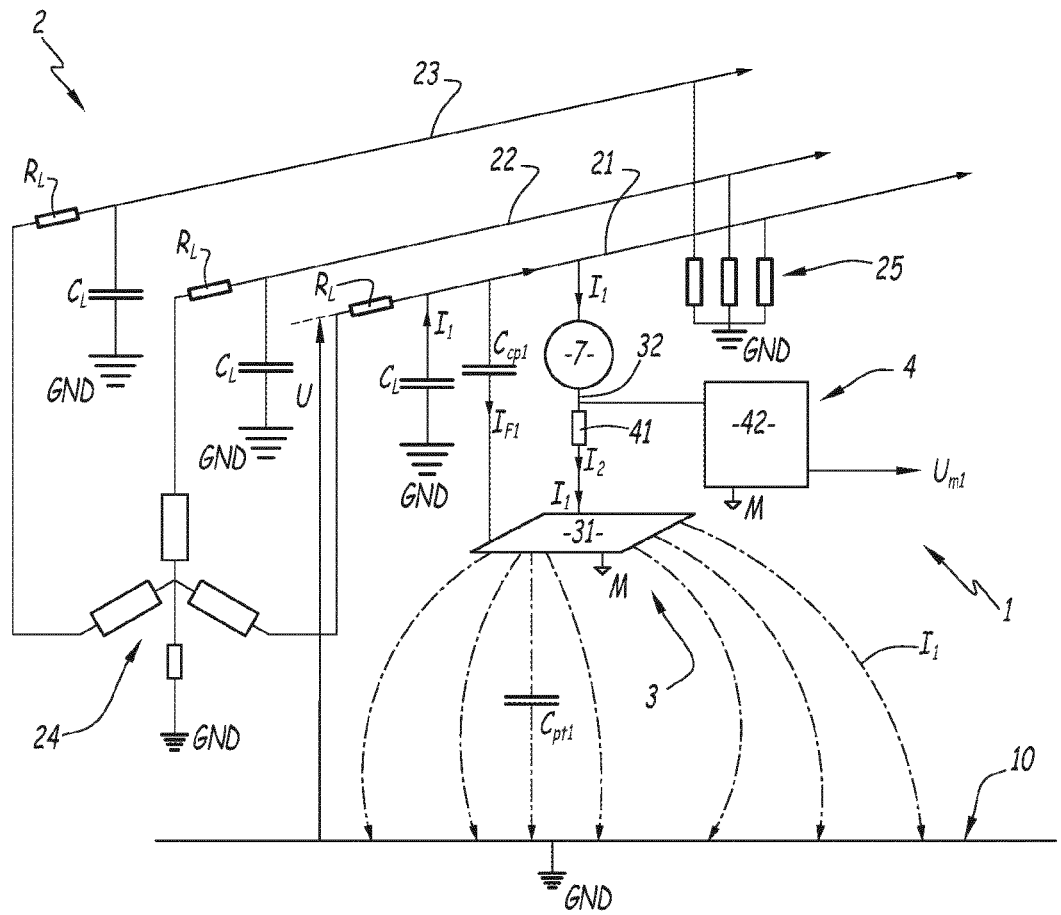
FIG. 1 schematically shows a portion of an overhead electrical network provided with a device according to a first embodiment of the invention for measuring an electrical quantity of a phase of an AC electric current of this network.

FIG. 1 shows a device 1 for measuring an electrical quantity of one phase of an AC current of an overhead electrical network 2.

The network 2 is configured to transport an AC electric current. For example, the network 2 is a medium-voltage electrical distribution network. In this example, this AC electric current is a three-phase current and has a frequency of 50 Hz. Alternatively, this current has a frequency of 60 Hz.

For example, the network 2 includes three overhead electric lines 21, 22, 23, to respectively convey three electrical phases of the three-phase AC current previously described. These three lines 21, 22, 23 are assumed to be identical. Therefore, only the line 21 is described in detail hereinafter.

The line 21 electrically connects a power source 24 of the network 2 to an electric charge 25 to be powered. The source 24 generates the AC electric current, while the charge 25 consumes this current. The source 24 here includes a high-voltage—medium-voltage transformer. In a known manner, the electrical properties of the line 21 are modeled using a line impedance $R_L$, placed in series between the source 24 and the charge 25, and a line capacity $C_L$, which electrically connects the line 21 to the ground 10.

The line 21 extends in the air and above the ground 10. It extends at a height H relative to the ground 10. The height H is measured between the line 21 and the ground 10 along a vertical axis (not shown), at the location where the device 1 is positioned. The height H is for example greater than or equal to 3 m, more preferably greater than or equal to 5 m. Here, the height H is equal to 10 m.

In this example, the electrical quantity that one wishes to determine using the device 1 is the electric voltage U of the electrical phase associated with the line 21, relative to the ground 10. The ground 10 here is electrically connected to the electrical ground GND.

The device 1 includes a sensor 3, a generator 7 and a computation unit 8.

The sensor 3 includes an electrically conductive plate 31 and an electrical conductor 32. The sensor 3 is further configured to be attached to the line 21, and alternately, detached from the line 21. To that end, it includes an attachment device to the line 21, such as a clamp or hook.

The conductor 32 electrically connects the plate 31 to the electric line 21. It allows the circulation of an electric current $I_1$ from the line 21 to the first plate 31 when the sensor 3 is attached to the line 21. The frequency of the current $I_1$ here is substantially equal to the frequency of the three-phase electric current circulating in the network 2. This frequency is for example equal to 50 Hz.

Reference "d" denotes the distance between the plate 31 and the line 21 when the sensor 3 is attached to the line 21. This distance d is measured between the line 21 and the geometric center of the first plate 31. Advantageously, the distance d is less than 5% or 2% of the height H. Preferably, the distance d is comprised between 1 cm and 1 m, for example equal to 10 cm.

Reference "D" denotes the distance between the plate 31 and the ground 10 when the sensor 3 is attached to the line 21. This distance D is measured along the vertical axis between the geometric center of the plate 31 and the ground 10. For example, the distance D is at least greater than 50% of the height H.

The plate 31 forms a capacitor with an electrical capacity $C_{pt1}$ relative to the ground 10, called plate-earth capacity. Thus, when the sensor 3 is attached to the line 21, the line capacity $C_L$, on the one hand, and the assembly formed by the conductor 32, the plate 31 and therefore the plate-earth capacity $C_{pt1}$, on the other hand, are connected in parallel between the line 21 and the ground 10. The electric current $I_1$ circulates from the line 21 into the plate 31 and next circulates to the ground GND via the plate-earth capacity $C_{pt1}$, then to the line 21 via the line capacity $C_L$. When only the current $I_1$ circulates in the device 1, its value is then given by the formula:

$$U = \frac{I_1}{\omega \times C_{pt1}} \quad (1)$$

where Ω is the pulse of the AC electric current circulating in the network 2.

The value of the plate-earth capacity $C_{pt1}$ for example depends on the dimensions of the plate 31, the distance D and the dielectric properties of the medium separating the plate 31 from the ground 10, here air. These dielectric properties depend on environmental conditions, such as the temperature or the humidity level of the air around the plate 31. In this example, the value of the plate-earth capacity $C_{pt1}$ is less than or equal to 10 picoFarad, preferably less than or equal to 1 picoFarad, and is greater than or equal to 10 femtoFarad, preferably greater than or equal to 100 femtoFarad.

The plate 31 here has a planar shape. Alternatively, the plate 31 has a different shape, for example curved. The surface area of the plate 31 here is smaller than 100 cm², or even 50 cm², for example equal to 12 cm².

The plate 31 is formed by an electrically conductive material, such as metal. Here, a metal layer is deposited on a nonmetal substrate, such as an epoxy resin plate.

Due to this dependency of the value of the plate-earth capacity $C_{pt1}$ on the environmental conditions, the measurement of the electric current $I_1$ alone is not sufficient to obtain a precise determination of its value.

To that end, an electric current $I_2$ is injected through the conductor 32, then measured separately from the current $I_1$. The current $I_2$ has a frequency different from the frequency of the current $I_1$. For example, the current $I_2$ has a frequency comprised between 1 kHz and 1 MHz, preferably between 10 kHz and 100 kHz. In this example, the current $I_1$ has a frequency equal to 50 kHz.

To that end, the generator 7 is electrically connected to the conductor 32 and the line 21. More specifically, it connects the line 21 in series with one end of the conductor 32. The conductor 32 here is therefore not directly connected to the line 21.

This generator 7 for example includes a controllable pulse generator, electrically powered by a dedicated power circuit (not illustrated in FIG. 1). Reference "$U_P$" denotes the electric voltage across the terminals of the generator injecting the current $I_2$.

The device 1 further includes a measuring apparatus 4, configured to measure the electric current circulating through the conductor 32. In this example, the conductor 32 includes an electric resistance 41 that has a known value $R_m$. The apparatus 4 includes a voltage sensor 42 to measure an electric voltage across the terminals of the resistance 41. An electric voltage $U_1$ is established across the terminals of this resistance 41 when an electric current circulates through the conductor 32. Preferably, the resistance $R_m$ does not depend on the frequency.

The apparatus 4 further includes a frequency filtering circuit for the current measured in the conductor 32. This filtering circuit is able to selectively eliminate, from the current measured in the conductor 32, components of this current having one or several predefined frequencies. This then makes it possible to measure the currents $I_1$ and $I_2$ with different frequencies separately. Here, this filtering circuit is integrated into the voltage sensor 42.

In this example, the apparatus 4 has a measuring gain G. The gain G here is equal to the ratio between the voltage $U_{m1}$ given by the apparatus 4 as the result of the measurement and the voltage $U_1$ across the terminals of the resistance 41. This gain G has a known value that is adjustable during the manufacture of the device 1.

Figure 2:
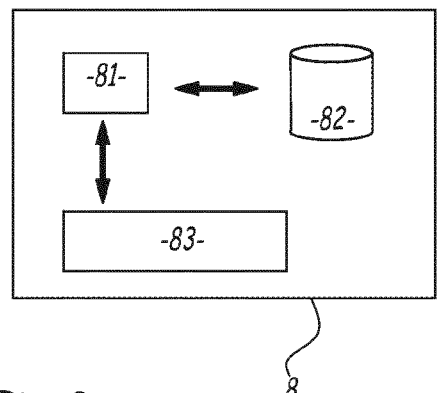
FIG. 2 schematically shows a computation unit of the measuring device of FIG. 1.

FIG. 2 shows an electronic computation unit 8 of the device 1. This unit 8 includes an electronic computer 81, an information recording medium 82 and a data exchange interface 83 that communicate with one another via a data exchange bus of the unit 8. The computer 81 is configured to execute instructions contained in the medium 82. For example, it involves a microprocessor. The medium 82 records instructions to execute the method of FIG. 3 when they are executed by the computer 81. For example, the medium 82 includes a non-volatile memory module, such as a Flash or EEPROM module. The interface 83 allows a data exchange between the unit 8, the apparatus 4 and the generator 7, to which it is connected by data links that are not illustrated.

The unit 8 is configured to compute the value of the plate-earth capacity $C_{pt}$. The unit 8 is further configured to compute the electric voltage U of the phase of the current circulating in the line 21 from values of the current $I_1$ measured by the apparatus 4, as well as the computed plate-earth capacity $C_{pt1}$. This computation of the value of the plate-earth capacity $C_{pt1}$ is done here according to the formula:

$$U_p = \frac{I_2}{\omega \times C_{pt1}} \quad (2)$$

The injection of the current $I_2$ with a known amplitude makes it possible to measure the value of the plate-earth capacity $C_{pt1}$ before a measurement of the voltage U, so as to take account of an updated value of the plate-earth capacity $C_{pt1}$ during the determination of the voltage U. In this way, the device 1 is calibrated easily and simply, to obtain a more reliable measurement of the voltage U. On the contrary, in the state of the art, the determination of the voltage U is done with a predefined value of the plate-earth capacity $C_{pt1}$.

The choice of a frequency of the current $I_2$ different from that of the current $I_1$ makes it possible to measure these currents $I_1$ and $I_2$ separately using the same apparatus 4.

An example operation of the device 1 for measuring the electric voltage U of the electric phase associated with the line 21 will now be described in reference to the flow chart of FIG. 3 and using FIGS. 1 and 2.

Initially, during a step 1000, the device 1 is connected to the line 21. For example, the sensor 3 is attached to the line 21, using the attachment device. Once this sensor 3 is attached, the current $I_1$ circulates from the line 21 to the plate 31.

Next, during a step 1002, the electric current $I_2$ is injected by the generator 7 through the conductor 32. For example, the unit 8 commands the generator 7 so that it generates one or several electric pulses across its terminals with the voltage $U_P$. The current $I_2$ next circulates toward the line 21 via the plate 31, the electric ground GND, the plate-earth capacity $C_{pt1}$ and the line capacity $C_L$.

During a step 1004, the injected electric current $I_2$ is measured in the conductor 32, via the measuring apparatus 4. For example, the voltage sensor 42 measures the voltage $U_1$, which corresponds to the superposition of the currents $I_1$, $I_2$ circulating in the conductor 32. The measured voltage $U_1$ is then frequency-filtered to eliminate the low-frequency component therefrom that corresponds to the current $I_1$, for example with a cutoff frequency equal to 1 kHz to eliminate the components corresponding to frequencies below 1 kHz. The voltage sensor 42 next delivers the value $U_{m1}$ as result of the measurement.

During a following step 1006, the unit 8 determines the value of the plate-earth capacity $C_{pt1}$ based on the currents measured by the apparatus 4 during step 1004. For example, the voltage $U_{m1}$ is acquired by the unit 8. The unit 8 next computes the value of the plate-earth capacity $C_{pt1}$ according to equation (2) mentioned above.

These steps 1002, 1004 and 1006 thus form a calibration sequence of the device 1, to update the value of the plate-earth capacity $C_{pt1}$. In this way, the later steps of the method are carried out with the updated capacity value.

During a later step 1008, the value of the current $I_1$ circulating in the conductor 32 is measured using the apparatus 4. At this stage, it is no longer necessary to inject the current $I_2$. For example, the generator 7 is stopped. For example, the voltage sensor 42 measures the voltage $U_1$ across the terminals of the conductor 32. The measured signal is frequency-filtered to eliminate the high-frequency component and thus retains only the component that corresponds to the current $I_1$, for example with a cutoff frequency equal to 1 kHz. The voltage sensor 42 then delivers the value $U_{m1}$ as result of the measurement.

Lastly, during a step 1010, the voltage U is determined by the unit 8 from the current $I_1$ measured by the apparatus 4 during step 1008 and the value of the plate-earth capacity $C_{pt1}$ computed during step 1006. For example, the value of the voltage $U_{m1}$ measured during step 1008 is acquired by the unit 8. The computation of the voltage U is then done using equation (1) previously defined.

Although the determination of the plate-earth capacity $C_{pt1}$ is improved owing to the device 1, it may still be further improved. Indeed, when the sensor 3 is attached to the line 21, a first stray electrical capacity $C_{cp1}$ forms between the plate 31 and the line 21. This first stray capacity $C_{cp1}$ generates the circulation of a first electric leak current $I_{F1}$ circulating from the line 21 via the conductor 32 and the plate 31 toward the line 21. The intensity of the first leak current $I_{F1}$ depends on the value of the first stray capacity $C_{cp1}$. The value of the first stray capacity $C_{cp1}$ in particular depends on the distance d between the first plate 31 and the line 21. The first leak current $I_{F1}$ has a frequency greater than that of the current $I_1$. The first stray capacity $C_{cp1}$ corresponds to a sum of several stray capacities.

Figure 4:
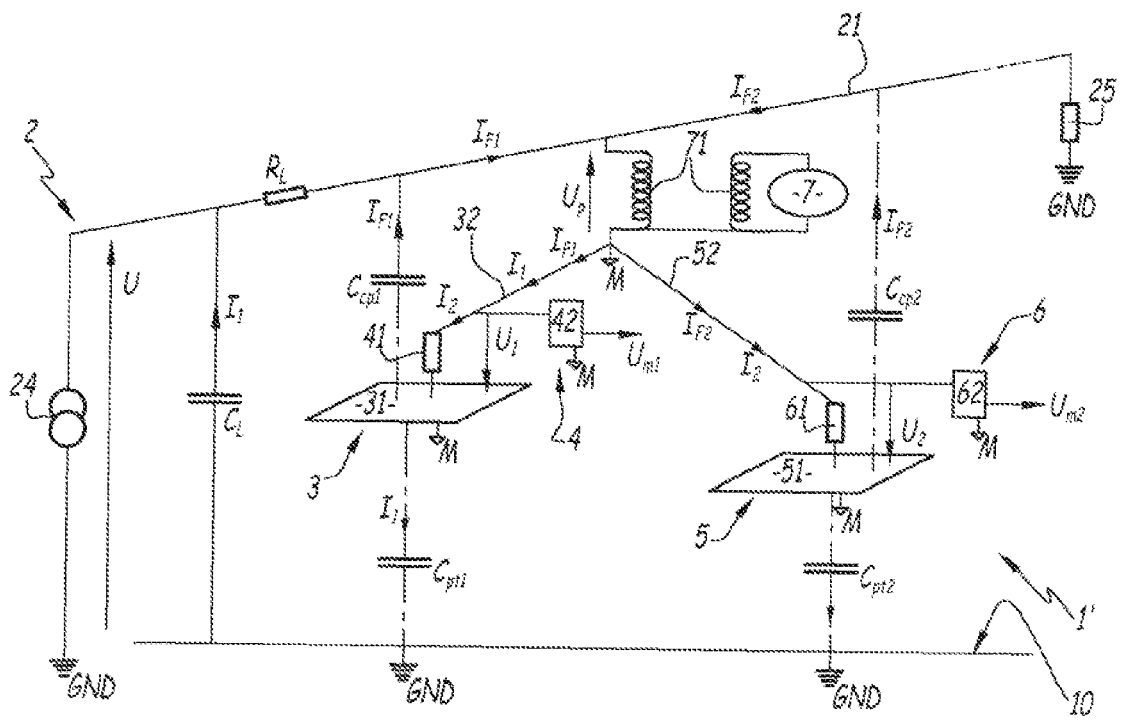
FIG. 4 schematically shows a portion of an overhead electrical network provided with a device according to another embodiment of the invention for measuring an electrical quantity of a phase of an AC electric current of this network.

FIG. 4 shows a device 1' for measuring the electrical quantity in the overhead electrical network 2, which advantageously replaces the device 1 while still further improving the determination of the first plate-earth capacity $C_{pt1}$. To simplify FIG. 4, the lines 22 and 23 are not shown. The device 1' includes the sensor 3, hereinafter called first sensor 3, and a second sensor 5, the generator 7 and the computation unit 8.

Hereinafter, similarly, the plate 31 and the conductor 32 are respectively called "first plate 31" and "first conductor 32", the plate-earth capacity $C_{pt1}$ is called "first capacity $C_{pt1}$" and the apparatus 4 is called "first apparatus 4".

The second sensor 5 includes a second electrically conductive plate 51 and a second electrical conductor 52. The second sensor 5 is further configured to be attached to the line 21.

In this example, the sensors 3 and 5 are mechanically connected to one another. For example, they are housed inside a same housing (not shown) of the device 1. Thus, the sensors 3 and 5 are attached to the line 21 simultaneously, for example using the attachment device of the first sensor 3. Alternatively, this attachment device belongs to the second sensor 5 or is outside the sensors 3 and 5. Alternatively, each of the sensors 3 and 5 includes its own attachment device.

Here, the sensors 3 and 5 are identical and differ only by their respective position relative to the line 21.

The second sensor 5 is attached to the line 21 at a distance "d'" different from the distance d. Reference D' denotes the height relative to the ground 10 of the second sensor 5.

Reference K denotes the ratio between the distance d' and the distance d. This ratio K is strictly greater than 1. For example, it is comprised between 2 and 50, and preferably between 2 and 10. In this example, the ratio K is equal to 2.

Advantageously, the sensors 3 and 5 are placed so as to be stationary relative to one another within the device 1' such that the distances d and d' and the ratio K do not vary once the sensors 3 and 5 are both attached to the line 21.

The second plate 51 and the second conductor 52 play the same role, respectively, as the plate 31 and the second conductor 32. Everything that was described in reference to the first plate 31 and the first conductor 32 respectively applies to the second plate 51 and the second conductor 52.

Thus, the second conductor 52 electrically connects the second plate 51 to the line 21, for the circulation of at least part of the electric current $I_1$ from the line 21 toward the second plate 51. Likewise, the second plate 51 defines an electrical capacity $C_{pt2}$ relative to the ground 10, called second plate-earth capacity. Thus, when the second sensor 5 is attached to the line 21, the line capacity $C_L$, on the one hand, and the assembly formed by the second conductor 52, the second plate 51 and therefore the second plate-earth capacity $C_{pt2}$, on the other hand, are connected in parallel between the line 21 and the ground 10. Thus, when only the current $I_1$ is circulating in the second conductor 52, its value is given by the formula:

$$U = \frac{I_1}{\omega \times C_{pt2}} \quad (3)$$

The value of the second plate-earth capacity $C_{pt2}$ for example depends on the distance D' and the dielectric properties of the medium separating the second plate 51 from the ground 10.

Likewise, reference $C_{cp2}$ denotes a second stray capacity between the second plate 51 and the line 21. This second stray capacity $C_{cp2}$ allows the circulation of a second electric leak current $I_{F2}$ circulating along the second conductor 52 and the second plate 51 toward the line 21. The intensity of the second leak current $I_{F2}$ depends on the value of the second stray capacity $C_{cp2}$. The value of the second stray capacity $C_{cp2}$ in particular depends on the distance d' between the plate 51 and the line 21.

In light of the value of the ratio K and the value of the distance d relative to the height H of the line 21, the distance D' here is of the same order of magnitude as the distance D, i.e., equal to within 10%, or even to within 5%, or even to within 2%. Furthermore, because the sensors 3 and 5 are located close to one another, for example at a distance smaller than 1 m, the dielectric properties of the medium separating the plates 31 and 51 from the ground are essentially the same. Furthermore, the plates 31 and 51 here are identical. As a result, the values of the first and second plate-earth capacities $C_{pt1}$ and $C_{pt2}$ are very close to one another and vary in concert with one another when the dielectric properties of the air vary. These first and second plate-earth capacities $C_{pt1}$ and $C_{pt2}$ are then considered to be equal to a same plate-earth capacity value $C_{pt}$. Hereinafter and unless otherwise stated, the device 1 seeks to determine this plate-earth capacity value $C_{pt}$.

The first and second stray capacities $C_{cp1}$ and $C_{cp2}$ here have different values, the ratio of which preferably remains constant over time. The ratio between the values of the first and second stray capacities $C_{cp2}$ and $C_{cp1}$ depends on the ratio K. In theory, if the plates 31 and 51 are strictly identical and have a same orientation toward the line 21, this ratio between the values of the first and second stray capacities $C_{cp2}$ and $C_{cp1}$ is proportional to the ratio K. However, in practice, the plates 31 and 51 are not always identical, or oriented in the same way toward the line 21. This ratio is then not strictly proportional to the ratio K. In this example, this ratio is proportional to the ratio K to within 10%, or to within 20%, or to within 30%.

Reference K' denotes the ratio between the second leak current $I_{F2}$ and the first leak current $I_{F1}$. The ratio K' here therefore has a value that depends on the ratio K.

In practice, the value of the ratio K' is predefined, for example during a final manufacturing phase of the device 1'. To that end, a known voltage is measured using the device 1', and the value of the ratio K' is determined using equation (5) described below. The value of the ratio K' thus determined is recorded, for example, within the unit 8, and the values of the gains G and G' are adjusted accordingly. Since the ratio K is not supposed to vary during the operation of the device 1', the value of the ratio K' thus determined is subsequently usable.

In this example, the generator 7 is electrically connected to the conductors 32 and 52 as well as the line 21. More specifically, it connects the line 21 in series with a junction point between the respective ends of the conductors 32 and 52. The conductors 32 and 52 here are therefore not directly connected to the line 21. Here, the connection of the generator 7 to the line 21 and the sensors 3 and 5 is done using a transformer 71. Output terminals of the generator 7 are connected to a first winding of the transformer 71. This first winding is coupled to a second winding of the transformer 71 that connects the line 21 to a junction point between the respective ends of the conductors 32 and 52. Here, this junction point is connected to a floating electric ground M. Alternatively, the transformer 71 is not present. The generator 7 is then connected directly in series between the line 21 and the junction point.

Advantageously, the ratio between, on the one hand, the distance between the generator 7 and the first plate 31, and on the other hand, between the generator 7 and the second plate 51, is equal, to within 5%, or even to within 2%, to the ratio K'. In this way, the electric coupling between the generator 7 and the second plate 51 is proportional, with a proportionality coefficient equal to the ratio K', to the electric coupling between the generator 7 and the first plate 31.

The device 1' further includes a second measuring apparatus 6. These first and second apparatuses 4 and 6 here are inside the housing of the device 1'. Alternatively, the first and second apparatuses 4 and 6 are arranged outside the housing of the device 1'.

The second apparatus 6 is configured to measure the electric currents circulating through the second conductor 52. The second apparatus 6 here includes a second voltage sensor 62. The second apparatus 6 plays the same role with respect to the second conductor 52 as the first apparatus 4 with respect to the first conductor 32. For example, the second apparatus 6 is identical to the first apparatus 4, with the only difference that the second apparatus 6 has a measurement gain denoted G'.

In this example, the second conductor 52 includes an electric resistance 61 that has a known value $R_m$. Reference $U_2$ denotes the electric voltage across the terminals of this resistance 61 when a current circulates in the second conductor 52, and "$U_{m2}$" denotes the result of the measurement of this voltage $U_2$. The gain G' is therefore equal to the ratio between $U_{m2}$ and $U_2$.

Advantageously, the values $R_m$ and $R'_m$ of the resistances 41 and 61 as well as the gains G and G' are chosen such that:

$$\frac{R'_m}{R_m} \times \frac{G'}{G} = K' \qquad (4)$$

to within 5%, or even to within 2%.

In this example, the values of the gains G and G' are equal. In this case, the ratio of the values $R'_m$ and $R_m$ is equal to within 5%, or even to within 2%, to the ratio K'.

Alternatively, the values of the resistances $R_m$ and $R'_m$ are equal. The ratio between the gain G' and the gain G is equal to within 5%, or even to within 2%, to the ratio K'. The gain values G and G' are for example adjusted to a desired value during the manufacture of the device 1' and are no longer subsequently modified. Alternatively, the gains G and G' are not incorporated into the apparatuses 4 and 6, but are added during the processing, by the unit 8, of the data measured by these apparatuses 4 and 6.

The apparatuses 4 and 6 are electrically powered by a power supply circuit separate from the power supply of the generator 7, for example a circuit shared by the apparatuses 4 and 6 and that is connected to the electric ground M.

Advantageously, the device 1' includes a material whose permittivity coefficient does not vary over time and surrounding the plates 31 and 51. For example, the inside of the housing of the device 1' is filled with a synthetic foam. This makes it possible to prevent the values of stray capacities from varying in an uncontrolled manner or independently of one another, if the dielectric properties of the surrounding air around the line 21 and the plates 31 and 51 vary.

In this example, the unit 8 is further configured to compute the value of the plate-earth capacity $C_{pt}$. The unit 8 is for example housed inside the housing of the device 1'. Alternatively, the unit 8 is offset outside this housing. The unit 8 is further configured to compute the electric voltage U of the phase of the current circulating in the line 21 from values of the current $I_1$ measured by the apparatuses 4 and 6, as well as the computed plate-earth capacity $C_{pt}$. This computation of the value of the plate-earth capacity $C_{pt}$ is done here according to the formula:

$$C_{pt} = \frac{U_{m1} - U_{m2}}{\omega \times R_m (1 - K') \times (U_p - U_{m1})} \qquad (5)$$

The device 1' thus makes it possible to compute the value of the plate-earth capacity $C_{pt}$ without taking account of the stray leak currents that are superimposed on the current $I_2$ during the measurement of this current $I_2$. Indeed, the leak currents $IF_1$ and $IF_2$ due to the strap capacities $C_{cp1}$ and $C_{cp2}$ have a frequency of the same order of magnitude as that of the current $I_2$. Since these leak currents $IF_1$ and $IF_2$ are superimposed on the injected electric current $I_2$, they are measured at the same time as the current I$_2$ and are not distinguished from it. This introduces an error on the value of the computed plate-earth capacity C$_{pt}$. Owing to the choice of the gain values G, G' and the resistances R$_m$ and R'$_m$ according to the ratio K', the components of the electric current measured in the conductors 32 and 52 connected to these stray currents and superimposed on the current I$_2$ are simply eliminated by computing the difference between the measured voltage values U$_{m2}$ and U$_{m1}$, without it being necessary to use complex and more sophisticated measuring circuits. This results in a simpler computation of the value of the capacity C$_{pt}$, while also being precise.

Figure 3:
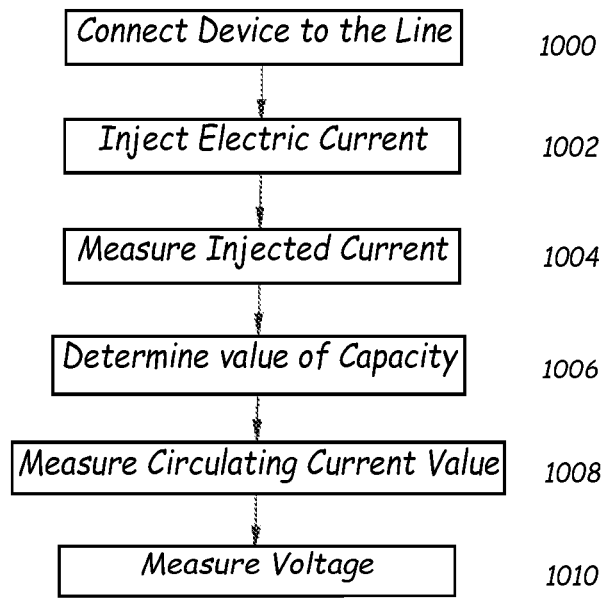
FIG. 3 is a flowchart of a method for measuring an electrical quantity of a phase of an alternating electric current using the measuring device of FIG. 1.

The operation of the device 1' to measure the electric voltage U of the electric phase associated with the line 21 is similar to that of the device 1 described in reference to the flowchart of FIG. 3, in particular with the difference that the sensors 3 and 5 work in concert, such that:

- during step 1000, the sensors 3 and 5 are simultaneously attached to the line 21, using the attachment device. Once these sensors 3 and 5 are attached, the current I$_1$ circulates from the line 21 to each of the plates 31 and 51.
- during step 1002, the electric current I$_2$ is injected by the generator 7 through the conductor 32 and the conductor 52 and next circulates toward the line 21 via the plates 31 and 51, the electric ground GND, the first and second plate-earth capacities C$_{pt1}$ and C$_{pt2}$ and the line capacity C$_L$.
- during step 1004, the injected electric current I$_2$ is measured in the conductors 32 and 52, respectively, via measuring apparatuses 4 and 6. The operation of the second voltage sensor 62 is similar to that of the first voltage sensor 42, with respect to the second conductor 52 and the leak current I$_{F2}$. The second voltage sensor 62 delivers the value U$_{m2}$ as result of the measurement.
- during step 1006, the unit 8 determines the value of the plate-earth capacity C$_{pt}$ based on the currents measured by each of the apparatuses 4 and 6 during step 1004. For example, the voltages U$_{m1}$ and U$_{m2}$ are acquired by the unit 8. The unit 8 next computes the value of the plate-earth capacity C$_{pt}$ according to formula (5) defined above.
- during a step 1010, the voltage U is determined by the unit 8 from the current I$_1$ measured by the apparatuses 4 and 6 during step 1008 and the value of the plate-earth capacity C$_{pt}$ computed during step 1006. For example, the value of the voltage U$_{m1}$ measured during step 1008 is acquired by the unit 8. The computation of the voltage U is then done using equation:

$$U \approx \frac{I_1}{\omega \times C_{pt}} \quad (6)$$

The invention claimed is:

1. A device for measuring an electrical quantity of one phase of an AC electric current of an overhead electrical network, comprising:
    a sensor, configured to be attached to an electric line of the overhead electrical network, this sensor comprising:
        an electrically conductive plate, and
        an electrical conductor, configured to electrically connect the plate to the electric line, for the circulation of a first electric current from the electric line through the electrical conductor,
    a computation unit, configured to determine the electrical quantity from a value of the first electric current and a value of an electrical capacity between the plate and the ground,
wherein the device further includes:
    a generator, electrically connected to the electrical conductor and configured to inject a second electric current through the electrical conductor, this second electric current having a frequency different from the frequency of the first electric current,
    the computation unit further being configured to compute the value of the electrical capacity between the plate and the ground as a function of a value of the second electric current.

2. The device according to claim 1, wherein it further includes:
    a second electrically conductive plate, and
    a second electrical conductor, configured to electrically connect the second plate to the electric line for the circulation of at least part of the first electric current from the electric line to the second plate through the second electrical conductor, the second electrical conductor being electrically connected to the output of the generator for the circulation of at least part of the second current injected through the second conductor.

3. The device according to claim 2, wherein the device further includes a second measuring apparatus configured to measure the first electric current and the second electric current circulating through the second electrical conductor.

4. The device according to claim 3, wherein the second electrical conductor has a second resistance, the second measuring apparatus including a second voltage sensor to measure the electric voltage across the terminals of the second resistance.

5. The device according to claim 1, wherein the device further includes a first measuring apparatus configured to measure the first electric current and the second electric current circulating through the electrical conductor.

6. The device according to claim 5, wherein the first electrical conductor has a first resistance, the first measuring apparatus including a first voltage sensor to measure the electric voltage across the terminals of the first resistance.

7. The device according to claim 6, wherein the electrical capacity C$_{pt}$ is computed by the computation unit according to the equation:

$$C_{pt} = \frac{U_{m1} - U_{m2}}{\omega \times R_m(1 - K') \times (U_p - U_{m1})}$$

where U$_{m1}$ and U$_{m2}$ are respectively the electric voltages measured by the first and second measuring apparatuses, ω is the pulse of the AC current circulating in the overhead electrical network, U$_p$ is the electric voltage across the terminals of the generator injecting the second electric current, R$_m$ is equal to the value of the first resistance and K' is a numerical value that depends on the ratio between the distance d' and the distance d, d being the distance between the first plate and the electric line and d' being the distance between the second plate and the electric line.

8. The device according to claim 7, wherein:
    when the first and second sensors are attached to the electric line, the device includes first and second stray electrical capacities that respectively connect the first and second plates to the electric line and allow the circulation, from the electric line, of first and second electric leak currents, and the value K' is equal to the ratio between the second and first electric leak currents.

9. The device according to claim 1, wherein the frequency of the second injected electric current is comprised between 1 kHz and 1 MHz, preferably between 10 kHz and 100 kHz.

10. The device according to claim 1, wherein the electrical quantity is the voltage of the phase of the AC current.

11. A method for measuring an electrical quantity of one phase of an AC electric current of an overhead electrical network, comprising:
- a) attaching a sensor to an overhead electric line of the electrical network, this sensor comprising:
  - an electrically conductive plate, and
  - an electrical conductor, configured to electrically connect the plate to the electric line, such that a first electric current circulates from the electric line through the electrical conductor,
- b) measuring the first electric current circulating through the electrical conductor, using a measuring apparatus, and
- c) computing an electrical quantity, using a computation unit, from the measured first electric current and the value of the electrical capacity between the plate and the ground, wherein the method includes, before the attachment, a calibration sequence to determine a value of the electrical capacity, this calibration sequence comprising:
- i) injecting, using a generator, a second electric current through the electrical conductor, this second electric current having a frequency different from the frequency of the first electric current,
- ii) measuring, using the measuring apparatus, the second electric current circulating in the electrical conductor, and
- iii) determining, via the computation unit and based on the measured second electric current, the value of the electrical capacity.

* * * * *